United States Patent
Komatsu et al.

(10) Patent No.: US 7,592,942 B2
(45) Date of Patent: Sep. 22, 2009

(54) CIRCUIT AND METHOD FOR A/D CONVERSION PROCESSING AND DEMODULATION DEVICE

(75) Inventors: Susumu Komatsu, Kanagawa (JP); Masaki Nishikawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/026,673

(22) Filed: Feb. 6, 2008

(65) Prior Publication Data

US 2008/0191913 A1 Aug. 14, 2008

(30) Foreign Application Priority Data

Feb. 9, 2007 (JP) ............... 2007-031310

(51) Int. Cl.
*H03M 1/12* (2006.01)

(52) U.S. Cl. ...................... 341/155; 341/141

(58) Field of Classification Search ................. 341/155, 341/118, 119, 120, 158, 164, 165, 141; 375/316
See application file for complete search history.

(56) References Cited

U.S. PATENT DOCUMENTS 5,361,099 A * 11/1994 Kim ..................... 348/555

| 6,229,483 | B1 * | 5/2001 | Loostrom ................ 342/383 |
| 6,650,264 | B1 * | 11/2003 | Chan et al. ............... 341/143 |
| 7,203,222 | B1 * | 4/2007 | Conroy et al. ............ 375/219 |
| 2004/0028151 | A1 | 2/2004 | Arambepola et al. | |

FOREIGN PATENT DOCUMENTS

| JP | 06-120997 | 4/1994 |
| JP | 08-181614 | 7/1996 |

\* cited by examiner

*Primary Examiner*—Brian Young
(74) *Attorney, Agent, or Firm*—Turocy & Watson, LLP

(57) ABSTRACT

An A/D conversion processing circuit includes: a switch sequentially switching over multiple inputs to select each thereof according to input bandwidth of the multiple inputs or fixedly selecting a single input; an A/D converter obtaining a digital signal through sampling on a switch output with a sampling frequency according to a necessary signal bandwidth; an interpolation section performing on each signal from a separation section which separates signals included in an A/D converter output, an interpolation processing according to a sampling timing deviation in the A/D converter, to obtain a signal where the multiple inputs are digitally converted at the same sampling timing; and an output section outputting as-is an output of the A/D converter if a signal of the single input is inputted to the A/D converter from the switch, thereby allowing commonly using a single A/D converter for multiple inputs, restraining increased circuit scale and power consumption.

17 Claims, 8 Drawing Sheets

CIRCUIT AND METHOD FOR A/D CONVERSION PROCESSING AND DEMODULATION DEVICE

CROSS-REFERENCE TO RELATED APPLICATIONS

This application is based upon and claims the benefit of priority from the prior Japanese Patent Application No. 2007-031310, filed on Feb. 9, 2007, the entire contents of which are incorporated herein by reference.

BACKGROUND OF THE INVENTION

1. Field of the Invention

The present invention relates to a circuit and method for Analog-to-digital (A/D) conversion processing and a demodulation device which are used for a receiving device.

2. Description of Related Art

Conventionally in the field of data transmission, to address increase in transmission information amount, multiple-valued quadrature modulation has been employed in some cases which is represented by quadrature amplitude modulation (QAM) as a highly efficient modulation/demodulation method that allows transmitting a large amount of data without expanding a bandwidth.

QAM is performed by placing a symbol on each of lattice coordinate points on an IQ (in-phase and quadrature-phase) plane and assigning a predetermined bit count of digital code to each of the symbols. In a QAM modulator, digital data is converted in parallel for each predetermined bit count, and the converted parallel data is assigned to each of the symbols on the IQ plane. Values of the symbols in I, Q axes (I signal and Q signal) are subject to quadrature modulation to create a QAM-modulated wave to be transmitted.

On the other hand, a QAM demodulator determines the I, Q signals by quadrature detection using a carrier frequency of a reception signal. The QAM demodulator determines symbol positions on the IQ plane from the I, Q signals to obtain original data. Japanese unexamined patent publication No. 6-120997 (hereinafter referred to as document 1) discloses this kind of digital demodulation circuit technique. According to the proposal of the document 1, analog I, Q signals from a quadrature detection circuit are converted by two A/D converters to digital signals, respectively, from which signals, symbols are subsequently detected.

Incidentally, in recent years, a television receiver, etc., uses not only a composite signal but also I, Q signals as component signals for signal transmission from a tuner to a demodulation IC (integrated circuit), in some cases. That is, the tuner outputs an intermediate frequency (IF) signal as-is to the demodulation IC, or the tuner includes a quadrature detection circuit, outputs of which, i.e., I, Q signals, being outputted to the demodulation IC (Integrated Circuit).

In this case, a demodulation IC input stage requires a total of three A/D converters: one for high speed operation supporting the IF signal, and two for low speed operation supporting the I, Q signals. However, in an assumptive case of employing only one of the two systems of input signals, an unused A/D converter would turn out to be provided in the demodulation IC. Another problem is that the three A/D converters consume comparatively a large amount of electric power.

Note that similar problems as above also occur when converting three or more input signals to digital signals regardless of the kind of the input signals, for example when digitally converting each reception signal in diversity reception.

BRIEF SUMMARY OF THE INVENTION

An A/D conversion processing circuit according to one aspect of the invention includes: a switch which selects an input from each of multiple systems, and which, if a system of a selected input has multiple inputs, sequentially switches over the multiple inputs to select each of the multiple inputs, and if a system of a selected input has a single input, fixedly selects the single input; an A/D converter which converts an output of the switch to a digital signal, the A/D converter obtaining the digital signal by performing sampling with a sampling frequency according to a necessary signal bandwidth; a separation section which separates signals included in an output of the A/D converter; an interpolation section which performs on each signal from the separation section an interpolation processing according to a deviation in sampling timing in the A/D converter, to obtain a signal where the multiple inputs are digitally converted at the same sampling timing; and an output section which outputs as-is an output of the A/D converter if a signal of the single input is inputted to the A/D converter from the switch.

Further, a demodulation device according to one aspect of the invention includes: the above-mentioned A/D conversion processing circuit; a quadrature detection circuit which quadrature-detects an output of the output section; and a switch section which selectively outputs one of an output of the interpolation section and an output of the quadrature detection circuit.

Furthermore, an A/D conversion processing method according to one aspect of the invention includes: if a system of an input selected by a switch which selects an input from each of multiple systems has multiple inputs, the switch sequentially switching over the multiple inputs to select each of the multiple inputs, and if a system of an input selected by the switch has a single input, the switch fixedly selecting the single input; converting an output of the switch to a digital signal by performing sampling of the output using a sampling frequency according to a necessary signal bandwidth by an A/D converter; separating signals included in an output of the A/D converter; performing interpolation processing on each of separated signals according to deviation in sampling timing in the A/D converter to obtain a signal where the multiple inputs are digitally converted at the same sampling timing; and outputting as-is an output of the A/D converter if a signal of the single input is inputted to the A/D converter from the switch.

DETAILED DESCRIPTION OF THE INVENTION

Referring to the drawings, embodiments of the present invention are described in detail below.

First Embodiment

Figure 1:
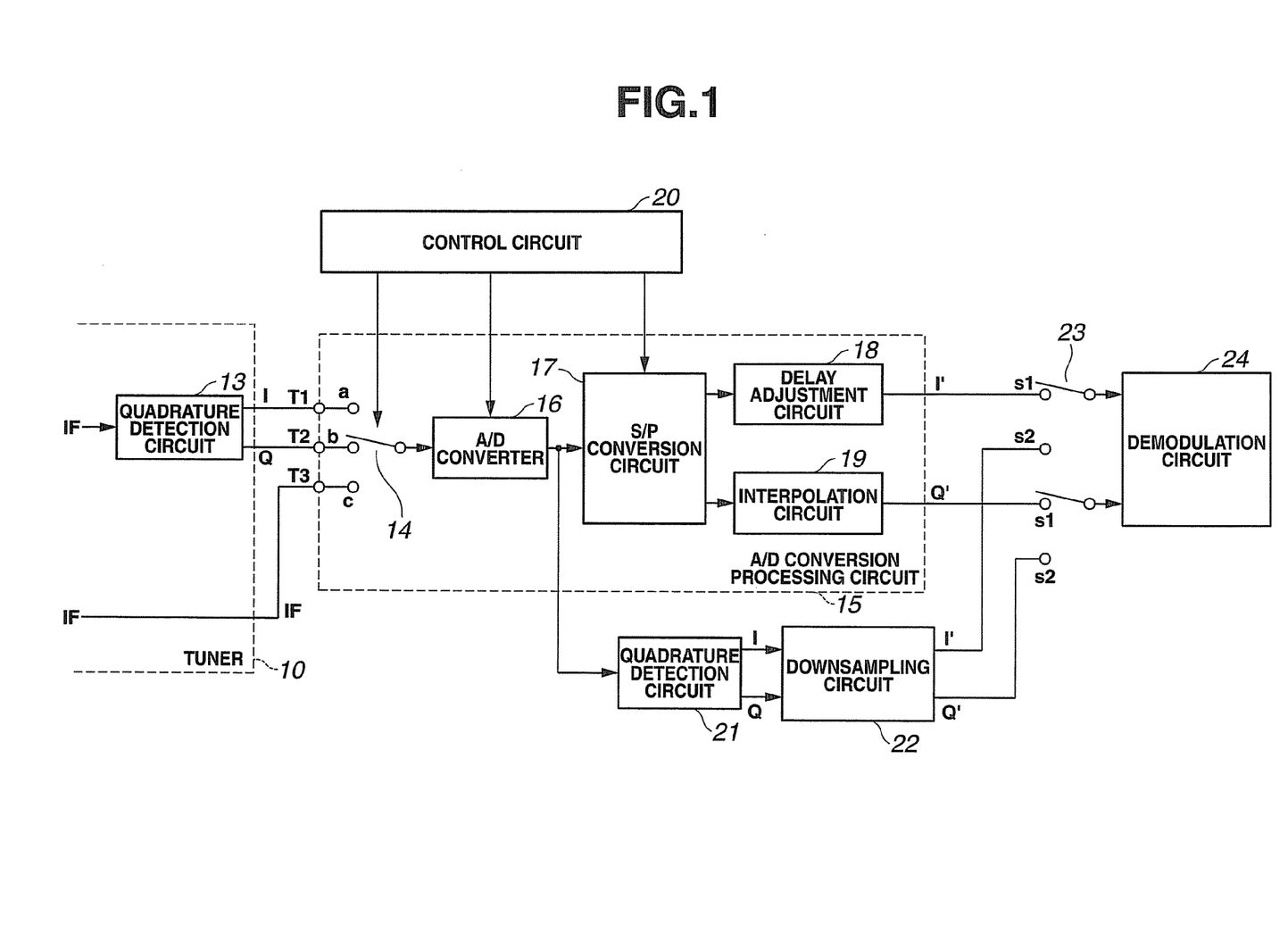
FIG. 1 is a block diagram showing a demodulation device incorporating an A/D conversion processing circuit according to a first embodiment of the present invention.

FIG. 1 is a block diagram showing a demodulation device incorporating an A/D conversion processing circuit according to a first embodiment of the present invention.

In FIG. 1, an A/D conversion processing circuit 15 includes a switch 14 at an input stage. The switch 14 has three terminals a-c that are connected to three input terminals T1-T3, respectively. FIG. 1 shows an example where the input terminals T1, T2 are supplied with I, Q signals, respectively, and the input terminal T3 with an IF signal.

A tuner 10 is supplied with a broadcast signal from an antenna not shown and selects a predetermined channel to generate an intermediate frequency (IF) signal. The tuner 10 includes a quadrature detection circuit 13, to which an IF signal is inputted. The quadrature detection circuit 13 can quadrature-detect the IF signal to generate I, Q signals aid output the generated I, Q signals. The tuner 10 can also output the IF signal as-is.

The I, Q signals from the tuner 10 are supplied to the terminals a, b of the switch 14 via the input terminals T1, T2, respectively. The IF signal from the tuner 10 is supplied to the terminal c of the switch 14 via the input terminal T3.

Note that, although FIG. 1 shows an example where a tuner that can output two systems of signals, i.e., the I, Q signals and the IF signal, is employed as the tuner 10, outputs of a tuner which can output only the I, Q signals may be supplied to the input terminals T1, T2, and an output of a tuner which can output only the IF signal may be supplied to the input terminals T3. Further, the tuner may be configured such that either only the outputs of the tuner which can output only the I, Q signals is supplied to the input terminals T1, T2, or only the output of the tuner which can output only the IF signal is supplied to the input terminal T3.

The switch 14 is controlled by a control circuit 20 described later, to selectively output the signals inputted to the terminals a-c to the A/D converter 16. In the present embodiment, when processing the I, Q signals from the tuner 10, the switch 14 switches over the terminals a, b at a comparatively low speed to selectively supply the I, Q signals to the A/D converter 16. When processing the IF signal from the tuner 10, the switch 14 fixedly selects the terminal c to supply the IF signal to the A/D converter 16.

The A/D converter 16 converts the inputted analog signal to a digital signal and outputs the converted digital signal. That is, the A/D converter 16 is supplied with a sampling clock from the control circuit 20 to conduct sampling of the inputted signal at the timing of the sampling clock, and outputs sample values as outputs to a S/P (serial to parallel) conversion circuit 17. The S/P conversion circuit 17 is controlled by the control circuit 20 to convert an inputted serial signal to a parallel signal.

That is, the switch 14 converts two analog signals supplied to the terminals a, b to a serial signal, and the S/P conversion circuit 17 returns the serial signal, which is digitally converted, to a parallel signal. In other words, using the switch 14 and the S/P conversion circuit 17 allows the single A/D converter 16 to time-divisionally perform A/D conversion processing on the two signals inputted to the terminals a, b.

According to the proposal of the above-mentioned document 1, analog I, Q signals from a quadrature detection circuit are converted by two A/D converters to digital signals, respectively, from which signals, symbols are subsequently detected, as mentioned above. In this case, however, difference in characteristics of the two A/D converters for the I, Q axes may in some cases cause mutually different gains and sampling timings with respect to the I, Q signals. The different gains and sampling timings of the A/D converter on the I, Q axes result in change of constellation extent. Either case leads to deterioration of demodulation performance.

Therefore, in the present embodiment, the two input signals (I, Q signals) inputted to the terminals a, b of the switch 14 are A/D converted using the single A/D converter 16 in a time-divisional manner. This prevents deviations in sampling timing and gain from occurring with respect to the I, Q signals.

The control circuit 20 interlockingly controls the switch 14, the A/D converter 16, and the S/P conversion circuit 17 according to a sampling timing of the A/D conversion processing. The control circuit 20 produces a sampling clock having a frequency twice the sampling frequency of I' signal and Q' signal which are outputs after being subjected to A/D conversion. For example, to assume the sampling frequency of the I' signal and the Q' signal after being subjected to A/D conversion as fsl (Hz), a clock having a frequency of 2 fsl (Hz) is used as the sampling clock. Note that, to satisfy the sampling theorem, the sampling frequency fsl is a frequency having not less than twice respective bandwidths of the two input signals.

In this case, the switch 14 switches over the terminals a, b at a cycle of 1/(2 fsl) [Hz], and the A/D converter 16 converts the two inputs from the terminals a, b to a digital signal using a sampling clock having a frequency of 2 fsl (Hz). That is, because the two inputs from the terminals a, b are time-divisionally processed according to the sampling clock, sampling timings of these two inputs differ by 1/(2 fsl) from each other. To take the sampling timing for one input as reference, the other input is sampled at a timing deviated by 1/(2 fsl [Hz]).

Accordingly, in the present embodiment, through interpolation processing by the interpolation circuit 19 using an output of the A/D converter with respect to the other input, sample values at the reference sampling timing are determined also for the other input. The interpolation circuit 19 outputs the determined sample values (interpolation signal). A delay adjustment circuit 18 outputs the sample values of the one input in a delayed manner by a time period necessary for the interpolation processing by the interpolation circuit 19. For example, the delay adjustment circuit 18 outputs the I' signal which is output in the I axis, and the interpolation circuit 19 outputs the Q' signal which is output in the Q axis, as shown in FIG. 1.

Figure 2:
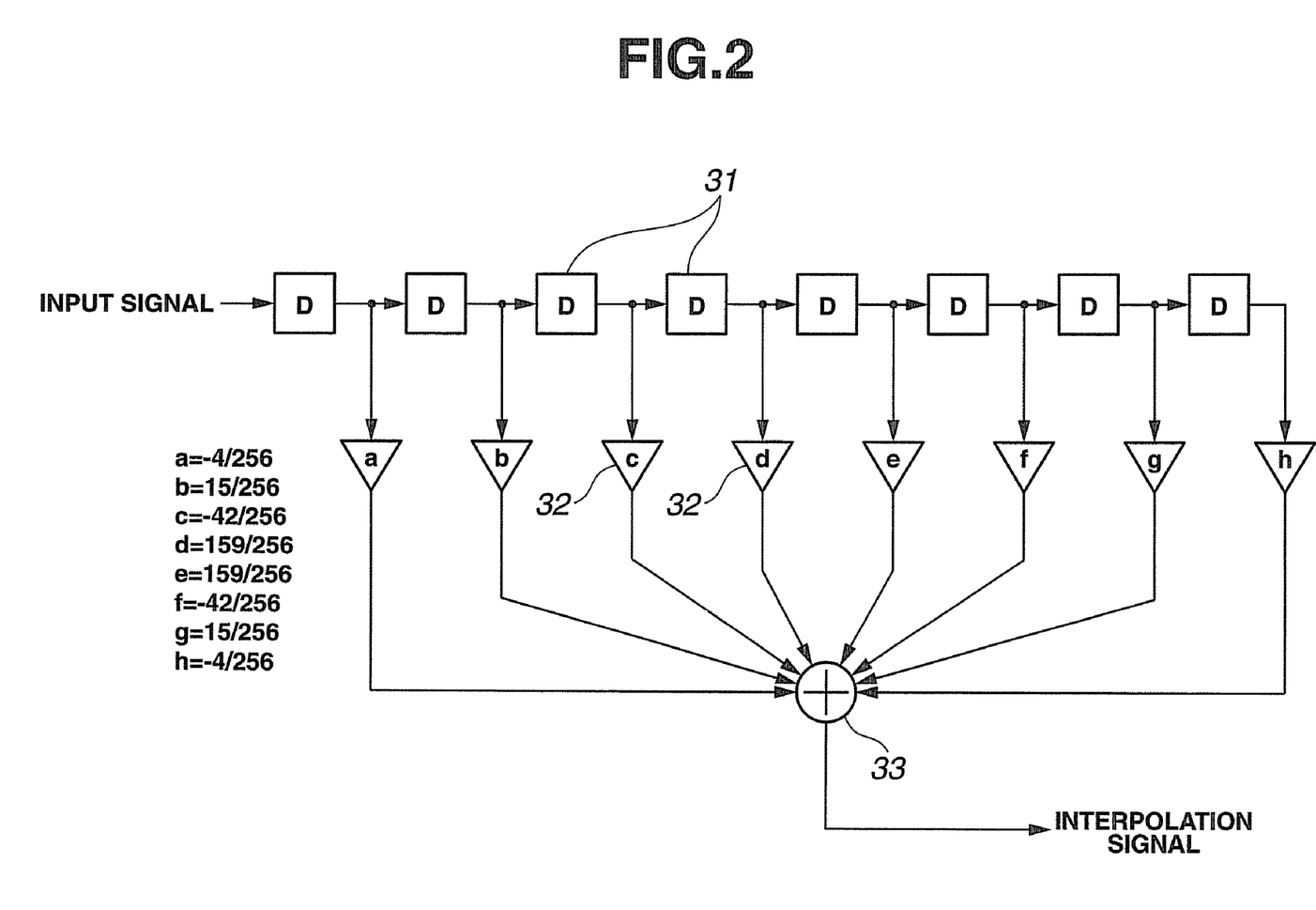
FIG. 2 is a circuit diagram showing an example of a specific configuration of an interpolation circuit 19 in FIG. 1.

FIG. 2 is a circuit diagram showing an example of a specific configuration of an interpolation circuit 19 in FIG. 1.

The interpolation circuit 19 can employ a transversal filter, for example. As shown in FIG. 2, the transversal filter includes a plurality of unit delay elements 31, a plurality of coefficient units 32, an adder 33, and a coefficient memory not shown.

The input signal is supplied to the plurality of unit delay elements 31 that are cascade-connected. Each of the unit delay elements 31 subjects a signal inputted thereto to unit delay and outputs a resulting signal to a next stage of the unit delay elements 31. Each input signal of the unit delay elements 31 and an output signal of the last stage of the unit delay elements 31 are provided to each of the coefficient units 32.

Each of the coefficient units 32 multiplies an input signal by a coefficient from the coefficient memory. Outputs of the coefficient units 32 are supplied to the adder 33. The adder 33 adds the outputs of the coefficient unit 32 to obtain an interpolation signal. Note that FIG. 2 shows an example of using eight samples of input signals. In the example of FIG. 2, as coefficients a-h of the coefficient units 32 are set −4/256, 15/256, −42/256, 159/256, 159/256, −42/256, 15/256, −4/256, so as to generate an interpolation signal at a sampling timing at the center of the eight samples.

The A/D conversion processing circuit 15 of the present embodiment can output an output of the A/D converter 16 also to a quadrature detection circuit 21. When the control circuit 20 controls the switch 14 to fixedly supply the IF signal inputted to the terminal c to the A/D converter 16, the control circuit 20 supplies the A/D converter 16 with a sampling clock having a frequency fsh (Hz) not less than twice the bandwidth of the IF signal. In this case, the A/D converter 16 converts the inputted IF signal to a digital signal using a sampling clock having the frequency fsh (Hz). The resulting output of the A/D converter 16 is supplied to the quadrature detection circuit 21.

Note that the frequencies fsl and fsh can adopt, for example, 10 MHz and 20 MHz, respectively. That is, by the A/D converter 16 adopting a single A/D converter for high-speed processing that operates at a sampling frequency of the comparatively high frequency fsh, the A/D converter 16 can not only operate at a high sampling frequency fsh when inputted with the IF signal, but also operate at a high sampling frequency of 2 fsl (≈fsh) also when inputted with the I, Q signals. Thus, the single A/D converter 16 supporting the IF signal is enabled to perform sampling of each of the I and Q signals with the frequency fsl.

The quadrature detection circuit 21 subjects an inputted digital IF signal to quadrature conversion to generate I, Q signals, which are outputted to a downsampling circuit 22. The downsampling circuit 22 downsamples the inputted signal having the sampling frequency fsh to the sampling frequency fsl to obtain I' and Q' signals.

The I' and Q' signals from the A/D conversion processing circuit 15 and the I' and Q' signals from the downsampling circuit 22 are supplied to a demodulation circuit 24 via a switch 23. When the A/D converter 16 is supplied with the I, Q signals from the terminals a, b, the switch 23 selects a terminal s1 to provide the I' and Q' signals from the A/D conversion processing circuit 15 to the demodulation circuit 24. When the A/D converter 16 is supplied with the IF signal from the terminal c, the switch 23 selects the terminal s2 to provide the I' and Q' signals from the downsampling circuit 22 to the demodulation circuit 24. The demodulation circuit 24 performs demodulation processing on the inputted signal.

Figure 3:
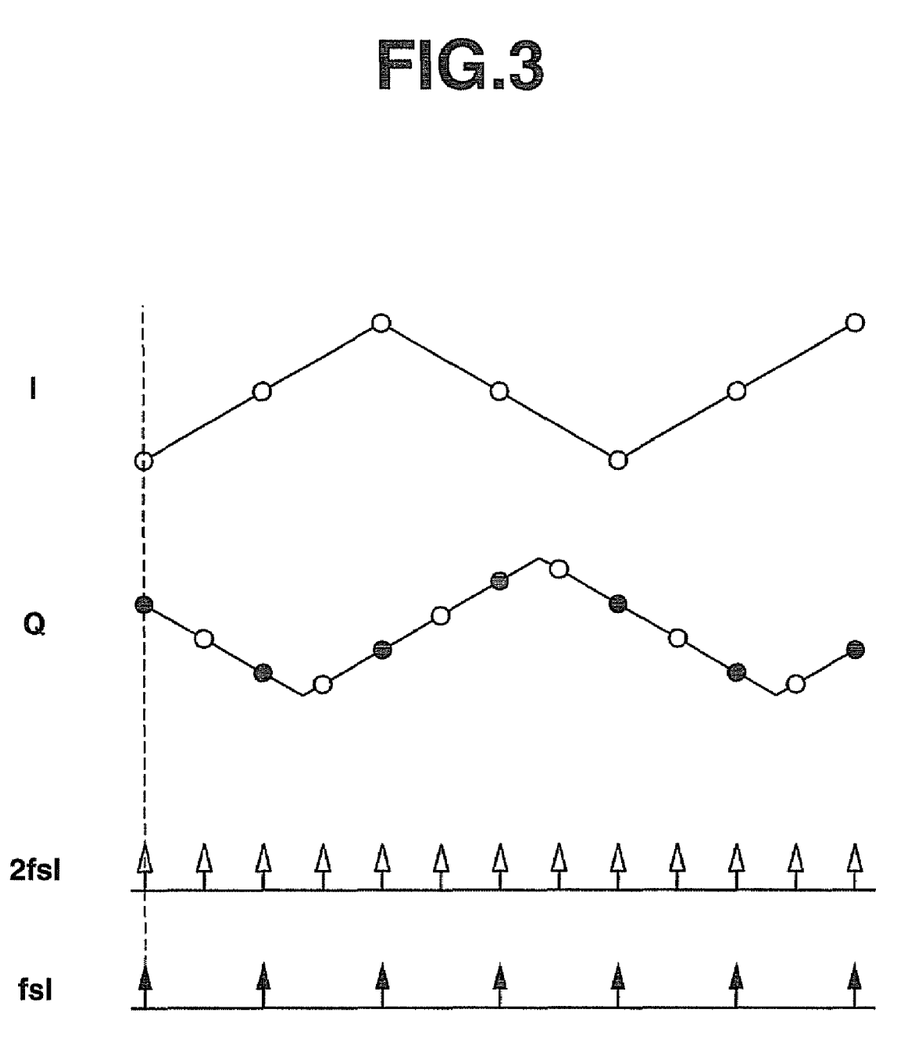
FIG. 3 is an illustrative view to illustrate an operation of the first embodiment.
Figure 8:
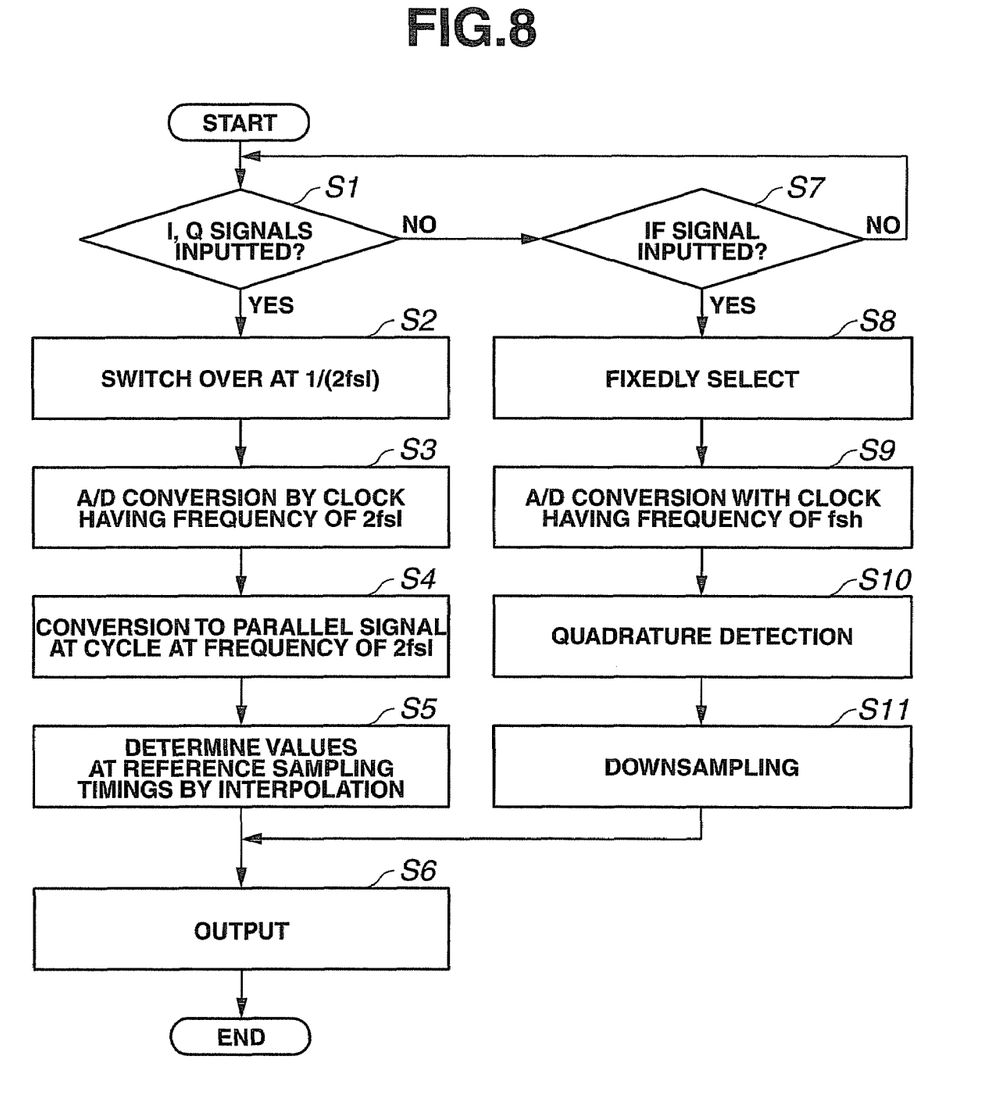
FIG. 8 is a flow chart to illustrate an operation of the first embodiment.

Next, operation of the embodiment thus configured is described referring to an illustrative view of FIG. 3 and a flow chart of FIG. 8. FIG. 3 shows wave forms of the I and Q signals inputted from the input terminals T1, T2, a sampling timing of the sampling frequency 2 fsl, and a sampling timing of the sampling frequency fsl.

It is now supposed that the I, Q signals are supplied to the A/D conversion processing circuit 15 from the tuner 10. The I, Q signals shown in FIG. 3 are switched over at a cycle of 1/(2 fsl) by the switch 14 to be supplied to the A/D converter 16 as a serial signal (steps S1, S2). The A/D converter 16 performs sampling at the sampling timing of the sampling clock having the frequency 2 fsl shown in FIG. 3 (step S3).

White dots of FIG. 3 show the sampling timing by the A/D converter 16. The A/D converter 16 outputs sample values of the white dot positions.

The S/P conversion circuit 17 separates outputs of the A/D converter 16 at the cycle of 2 fsl to parallelly output sample values of the I signal indicated by the white dots and sample values of the Q signal indicated by the white dots (step S4). The sample values of the Q signal are supplied to the interpolation circuit 19.

As is apparent from FIG. 3, each of the I and Q signals from the S/P conversion circuit 17 is a signal having the sampling frequency of fsl. However, if the sampling timing for the I signal is taken as a reference sampling timing, the sampling timing of the Q signal is deviated from the reference sampling timings by a cycle 1/(2 fsl). The interpolation circuit 19 determines sample values at the reference sampling timing with respect to the Q signal by interpolation processing. That is, the interpolation circuit 19 determines the sample values (black dots) at the reference sampling timings by using a plurality of sample values of the Q signal before and after the reference sampling timings (step S5). The interpolation circuit 19 outputs the sample values determined by the interpolation processing, as the Q' signal.

On the other hand, the delay adjustment circuit 18 delays the sample values of the I signal by a time period necessary for the interpolation processing of the interpolation circuit 19, so as to output the I' signal at the same reference sampling timing as that of the Q' signal, simultaneously with the Q' signal (step S6).

In this manner, the A/D conversion processing circuit 15 can digitally convert the I, Q signals by the single A/D converter 16, while maintaining the sampling frequency fsl which is necessary as the sampling frequency of the I', Q' signals.

The I', Q' signals from the A/D conversion processing circuit 15 are supplied to the demodulation circuit 24 via the switch 23 to be subjected to a predetermined demodulation processing by the demodulation circuit 24.

Next, it is supposed that the IF signal is supplied to the A/D conversion processing circuit 15 from the tuner 10. In this case, the control circuit 20 causes the switch 14 to fixedly select the terminal c (steps S7, S8), and supplies the A/D converter 16 with a sampling clock having the frequency fsh. The sampling frequency fsh is a frequency similar to the frequency of 2 fsl, and the A/D converter 16 uses this sampling clock to digitally convert the IF signal (step S9).

The IF signal digitally converted by the A/D converter 16 is supplied to the quadrature detection circuit 21. The quadrature detection circuit 21 generates I, Q signals from the inputted IF signal (step S10). The I, Q signals are subjected to downsampling by the downsampling circuit 22 to obtain I', Q' signals (step S11). The I', Q' signals are supplied to the demodulation circuit 24 via the switch 23 (step S6) to be subjected to a predetermined demodulation processing.

Thus, the present embodiment enables A/D conversion processing commonly using the single A/D converter by, when converting to a digital signal either a single signal in a comparatively broad band or two signals in a comparatively narrow band, by switching over these two systems of signal inputs (three signals) by the switch and controlling the sampling clock of the A/D converter according to the signal bandwidths of those two systems. Because only the single A/D converter has to be provided for the two systems of inputs, waste of configuration is prevented even if only one of the two systems of inputs is inputted. Moreover, because only the single A/D converter has to be operated, increase in power consumption can be restrained.

Note that Japanese unexamined patent publication No. 8-181614 (hereinafter referred to as document 2) discloses an A/D converter in which two inputs are supplied to a single A/D converter, the A/D converter is used in a time divisional manner, and an interpolation processing is conducted by the deviation in the processing timing due to the time division, to obtain a digital output supporting the two inputs.

However, the document 2 does not take signal bandwidth into consideration, which results in the sampling frequency of outputted data to be half the frequency of the sampling clock of the A/D converter. Therefore, if the frequency of the sampling clock of the A/D converter is less than twice the bandwidth of the input signal, the sampling theorem cannot be satisfied. Moreover, the document 2 does not at all disclose how the frequency of the sampling clock of the A/D converter is to be prescribed for when input signals having different signal bandwidths are inputted and for the case of three or more inputs. Thus, even if the technique of the document 2 were used, a system in which I, Q signals and an IF signal are inputtable is deemed to require two A/D converters for high-speed processing.

Second Embodiment

Figure 4:
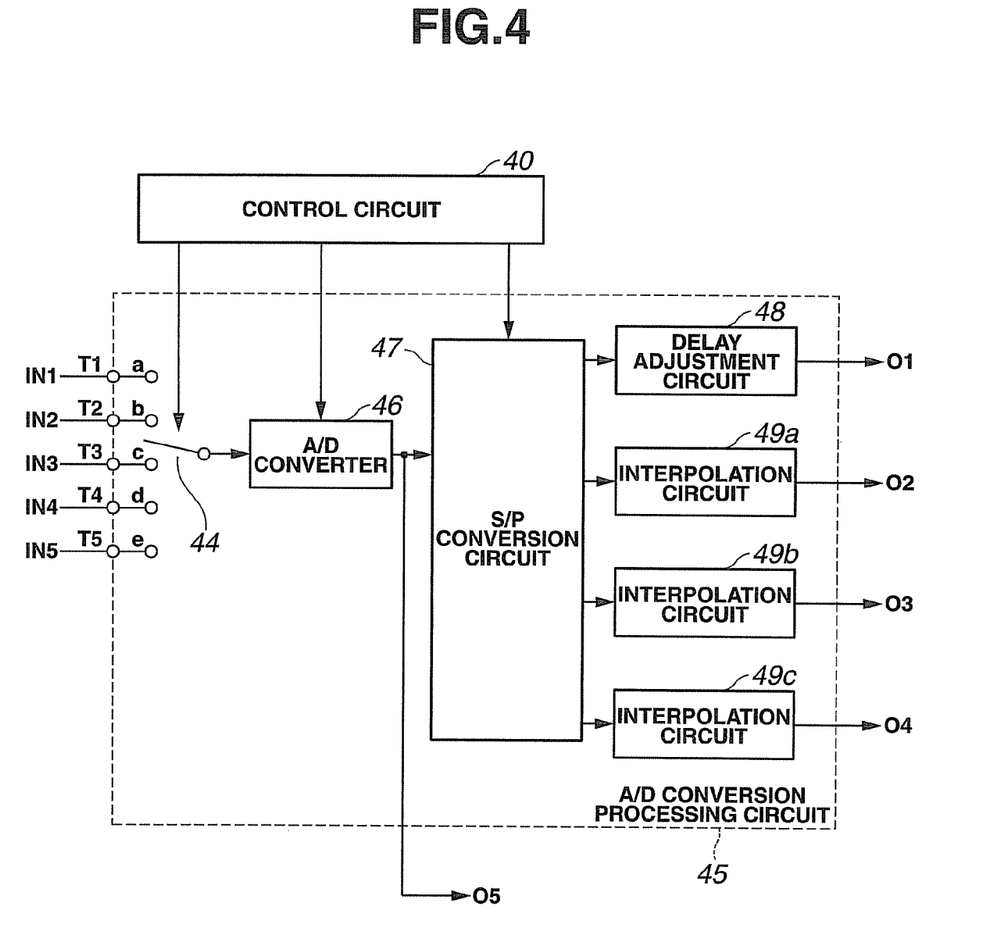
FIG. 4 is a block diagram showing an A/D conversion processing circuit according to a second embodiment of the present invention.

FIG. 4 is a block diagram showing an A/D conversion processing circuit according to a second embodiment of the present invention.

Although the first embodiment described an example where one of the two systems of inputs has one input and the other has two inputs, the other system may include multiple, i.e. three or more inputs. FIG. 4 is a block diagram showing a specific configuration of the A/D conversion processing circuit of such case.

In FIG. 4, a switch 44 at an input stage includes five terminals a-e that are connected to input terminals T1-T5, respectively. To the input terminal T5 is inputted a signal IN5 of a single input having a comparatively wide bandwidth. On the other hand, to the input terminals T1-T4 are inputted four inputs of signals IN1-IN4.

The switch 44 is controlled by the control circuit 40 to selectively output signals inputted to the terminals a-e to the A/D converter 46. In the present embodiment, when the four inputs of the signals IN1-IN4 are to be processed, the switch 44 switches the terminals a-d at a comparatively low speed to selectively supply the signal IN1-IN4 to the A/D converter 46. When the signal IN5 of a single input is to be processed, the switch 44 fixedly selects the terminal e to supply the signal IN5 to the A/D converter 46.

The A/D converter 46 converts an inputted analog signal to a digital signal and outputs the digital signal. That is, the A/D converter 46 is supplied with a sampling clock from the control circuit 40, performs sampling of the inputted signal at the timing of the sampling clock, and outputs sample values as outputs to a S/P conversion circuit 47. The S/P conversion circuit 47 is controlled by the control circuit 40 to convert an inputted serial signal to a parallel signal.

In other words, the switch 44 converts four analog signals supplied to the terminals a-d to a serial signal, and the S/P conversion circuit 47 returns the serial signal, which is digitally converted, to a parallel signal. By using the switch 44 and the S/P conversion circuit 47, the four signals inputted to the terminals a-d can be subjected to A/D conversion processing in a time-divisional manner by the single A/D converter 46.

The control circuit 40 interlockingly controls the switch 44, the A/D converter 46, and the S/P conversion circuit 47 according to a sampling timing of the A/D conversion processing. The control circuit 40 produces a sampling clock having a frequency of not less than a total of the sampling frequencies of signals O1-O4 which are outputs after the A/D conversion. For example, to assume that the sampling frequency of the signals O1-O4 after the A/D conversion is fsl (Hz), a clock having a frequency of 4 fsl (Hz) is used as the sampling clock.

In this case, the switch 44 switches over the terminals a-d at a cycle of 1/(4 fsl) [Hz], and the A/D converter 46 converts the four inputs from the terminals a-d to a digital signal using the sampling clock having the frequency of 4 fsl (Hz). That is, because the four inputs from the terminals a-d are time-divisionally processed according to the sampling clock, sampling timings of these four inputs differ by 1/(4 fsl) relative to one another. To take the sampling timing for one input as a reference sampling timing, the other inputs are subjected to sampling at timings each deviated by 1/(4 fsl [Hz]).

Accordingly, in the present embodiment, through interpolation processing by the interpolation circuits 49a-49c on the other inputs using an output of the A/D converter, sample values at the reference sampling timing are determined also for the other inputs. The interpolation circuits 49a-49c each output determined sample values (interpolation signal). A delay adjustment circuit 48 outputs the sample values of the one input in a delayed manner by a time period necessary for the interpolation processing by the interpolation circuits 49a-49c.

The A/D conversion processing circuit 45 of the present embodiment can output as-is an output of the A/D converter 46. When the control circuit 40 controls the switch 44 to fixedly supply the IN5 signal inputted to the terminal e to the A/D converter 46, the control circuit 40 supplies the A/D converter 46 with a sampling clock having a frequency fsh (Hz) not less than twice the bandwidth of the IN5 signal. In this case, the A/D converter 46 converts the inputted IN5 signal to a digital signal using the sampling clock having the frequency fsh (Hz) and outputs the converted digital signal as a signal O5.

Figure 5:
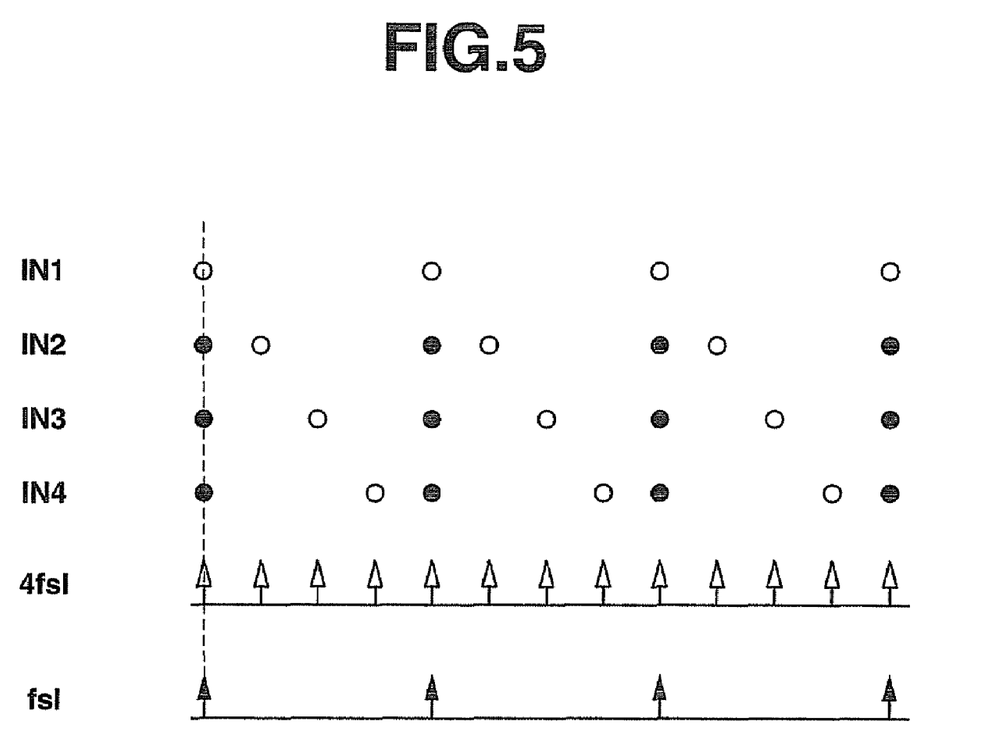
FIG. 5 is an illustrative view to illustrate an operation of the second embodiment.

Next, an operation of the embodiment thus configured is described referring to an illustrative view of FIG. 5. FIG. 5 shows sampling timings of the signals IN1-IN4 inputted from the input terminals T1-T4, sampling timings of a sampling clock having a frequency of 4 fsl, and sampling timings of a sampling clock having a frequency of fsl.

It is now supposed that the A/D conversion processing circuit 45 processes the four inputs of signals IN1-IN4. The signals IN1-IN4 are switched over at a cycle of 1/(4 fsl) by the switch 44 to be supplied to the A/D converter 46 as a serial signal. The A/D converter 46 performs sampling at the sampling timing of the sampling clock having the frequency of 4 fsl shown in FIG. 5. White dots of FIG. 5 show sampling timings by the A/D converter 46. The A/D converter 46 outputs sample values of the white dot positions.

The S/P conversion circuit 47 separates outputs of the A/D converter 46 at the cycle of 4 fsl to parallelly output the sample values shown by the white dots of the signals IN1-IN4. The sample values of the signals IN2-IN4 are supplied to the interpolation circuits 49a-49c, respectively.

Each of the signals IN1-IN4 from the S/P conversion circuit 47 is a signal having the sampling frequency of fsl. However, to assume the sampling timing for the signal IN1 as a reference sampling timing as shown in FIG. 5, sampling timings of the other signals IN2-IN4 are deviated by a cycle of 1/(4 fsl) to one another. The interpolation circuit 49a-49c determine sample values at the reference sampling timing with respect to the signals IN2-IN4, by interpolation processing. That is, the interpolation circuit 49a determines the sample values (black dots) at the reference sampling timing by using a plurality of sample values of the signal IN2 before and after the reference sampling timing. Likewise, the interpolation circuits 49b, 49c determine sample values (black dots) at the reference sampling timing by using a plurality of sample values of the signals IN3, IN4, respectively, before and after the reference sampling timing. The interpolation circuits 49a-49c output the sample values determined by the interpolation processing as the signals O2-O4, respectively.

On the other hand, the delay adjustment circuit 48 delays the sample values of the signal IN1 by a time period necessary for the interpolation processing of the interpolation circuits 49a-49c, to output the signal IN1 at the same reference sampling timing as those of the signals IN2-IN4, as the signal O1 simultaneously with each of the signals O2-O4.

In this manner, the A/D conversion processing circuit 45 can digitally convert the signals IN1-IN4 by the single A/D converter 46, while maintaining the sampling frequency fsl which is necessary as the sampling frequency of the signals O1-O4.

Next, it is supposed that the A/D conversion processing circuit 45 performs processing on the signal IN5. In this case, the control circuit 40 causes the switch 44 to fixedly select the terminal e to supply a sampling clock having the frequency fsh to the A/D converter 46. The sampling frequency fsh is a frequency similar to, e.g., the frequency 4 fsl, and the A/D converter 46 digitally converts the signal IN5 using this sampling clock. The signal IN5 digitally converted by the A/D converter 46 is outputted as-is as the signal O5.

Thus, the present embodiment enables A/D conversion processing commonly using the single A/D converter by, when converting to a digital signal either the one signal in the comparatively broad band or the four signals in the comparatively narrow band, switching over these two systems of signal inputs (five signals) by the switch and controlling the sampling clock of the A/D converter according to the signal bandwidths of those two systems to satisfy the sampling theorem. Because only the single A/D converter needs to be provided for the two systems of inputs, waste of configuration is prevented even if only one of the two systems of inputs is inputted. Moreover, because only the single A/D converter needs to be operated, increase in power consumption can be restrained.

Note that the above-described embodiment, showing an example where one of the two systems has one input and the other multiple inputs, is also adaptable to an example where both of the two systems have multiple inputs. That is, it is only necessary that the sum of sampling frequencies of the one system and the sum of sampling frequencies of the other system are not greater than a sampling frequency settable in the A/D conversion processing circuit. Furthermore, the embodiment is also adaptable to a case where sampling frequencies of signals of multiple inputs are different to one another.

Third Embodiment

Figure 6:
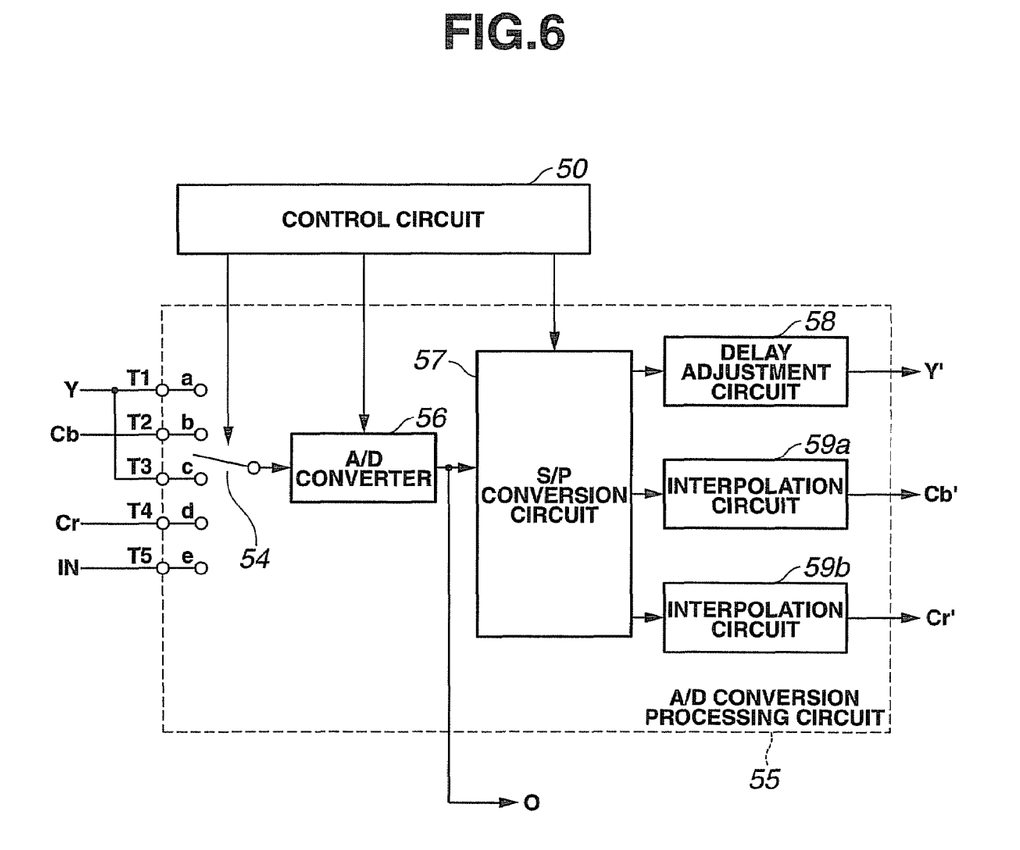
FIG. 6 is a block diagram showing an A/D conversion processing circuit according to a third embodiment of the present invention.

FIG. 6 is a block diagram showing an A/D conversion processing circuit according to a third embodiment of the present invention.

The present embodiment shows an example where bandwidths of multiple inputs of signals are different to one another. The following describes a case where, as such inputs, for example, component signals including a luminance signal Y and color difference signals Cr, Cb are inputted.

In FIG. 6, a switch 54 at an input stage includes five terminals a-e that are connected to input terminals T1-T5, respectively. To the input terminal T5 is inputted a single input of a signal IN in a comparatively wide bandwidth. On the other hand, to the input terminals T1-T4 are inputted three inputs of a luminance signal Y and color difference signals Cb, Cr.

The switch 54 is controlled by the control circuit 50 to selectively output signals inputted to the terminals a-e to the A/D converter 56. In the present embodiment, when processing the three inputs of the luminance signal Y and the color difference signals Cb, Cr, the switch 54 switches over the terminals a-d at a comparatively low speed to selectively supply the luminance signal Y and the color difference signals Cb, Cr to the A/D converter 56. When processing the single input of the signal IN, the switch 54 fixedly selects the terminal e to supply the signal IN to the A/D converter 56.

The luminance signal Y has a bandwidth of. e.g., 4 MHz, and the color difference signals Cb, Cr each have a bandwidth of 2 MHz. This requires the sampling frequency of the luminance signal Y to be 8 MHz and that of each of the color difference signals Cb, Cr to be 4 MHz. Accordingly, while sampling of the luminance signal Y is performed twice, each of the color difference signals Cb, Cr has only to be sampled once. In FIG. 6, for easy understanding of the description, the luminance signal Y is supplied to two input terminals T1, T3 and the color difference signals Cb, Cr to input terminals T2, T4, respectively, such that the switch 54 sequentially selects the input terminals T1-T4.

Note that it is also possible to configure the switch 54 by three terminals supporting three inputs, by changing the manner of selecting the input terminals.

The A/D converter 56 converts an inputted analog signal to a digital signal and outputs the converted digital signal. That is, the A/D converter 56 is supplied with a sampling clock from the control circuit 50 to perform sampling of the inputted signal at the timing of the sampling clock, and outputs sample values to a S/P conversion circuit 57. The S/P conversion circuit 57 is controlled by the control circuit 50 to convert an inputted serial signal to a parallel signal.

That is, the switch 54 converts three analog signals supplied to the terminals a-d to a serial signal, and the S/P conversion circuit 57 returns the serial signal, which is digitally converted, to a parallel signal. By using the switch 54 and the S/P conversion circuit 57, the three signals inputted to the terminals a-d can be subjected to A/D conversion processing in a time-divisional manner by the single A/D converter 56. The control circuit 50 interlockingly controls the switch 14, the A/D converter 56, and the S/P conversion circuit 57 according to a sampling timing of the A/D conversion processing.

The control circuit 50 causes the sampling clock supplied to the A/D converter 56 to have a frequency of, e.g., 16 MHz in order to make sampling frequency of a luminance signal Y' 8 MHz, and that of each of the color difference signals Cb, Cr, which are outputs after the A/D conversion 4 MHz.

The following shows in a generalized manner sampling clocks necessary in the present embodiment. It is now supposed that the sampling frequencies of the three signals are a·n (Hz), b·n (Hz), and c·n (Hz), respectively (n is an arbitrary real number). In this case, if a, b, c are all integers and are each a divisor of (a+b+c), then the sampling clock to be set to the A/D converter 56 is given as (a+b+c)·n (Hz).

The switch 54 switches over the terminals a-d at a cycle of 1/(16 [MHz]). The A/D converter 56 converts the three inputs from the terminals a-d to a digital signal using a sampling clock having a frequency of 16 (MHz). That is, because the three inputs from the terminals a-d are time-divisionally processed according to the sampling clock, the sampling timings of these three inputs differ by 1/(16 [MHz]) to one another. To assume a sampling timing to one input to be a reference sampling timing, the other inputs would be sampled at timings each deviated by 1/(16 [MHz]).

Interpolation circuits 59a, 59b determine sample values at the reference sampling timing also with respect to the other inputs, through interpolation processing using an output of the A/D converter with respect to the other inputs. The interpolation circuits 59a, 59b each output a determined sample value (interpolation signal). A delay adjustment circuit 58 outputs sample values of one input in a delayed manner by a time period necessary for the interpolation processing by the interpolation circuits 59a, 59b.

The A/D conversion processing circuit 55 of the present embodiment can output as-is an output of the A/D converter 56. When the control circuit 50 controls the switch 54 to fixedly supply the signal IN inputted to the terminal e to the A/D converter 56, the control circuit 50 supplies the A/D converter 56 with a sampling clock having a frequency fsh (Hz) not less than twice the bandwidth of the IN signal. In this case, the A/D converter 56 converts the inputted signal IN to a digital signal using a sampling clock having the frequency fsh (Hz) and outputs the digital signal as a signal O.

Figure 7:
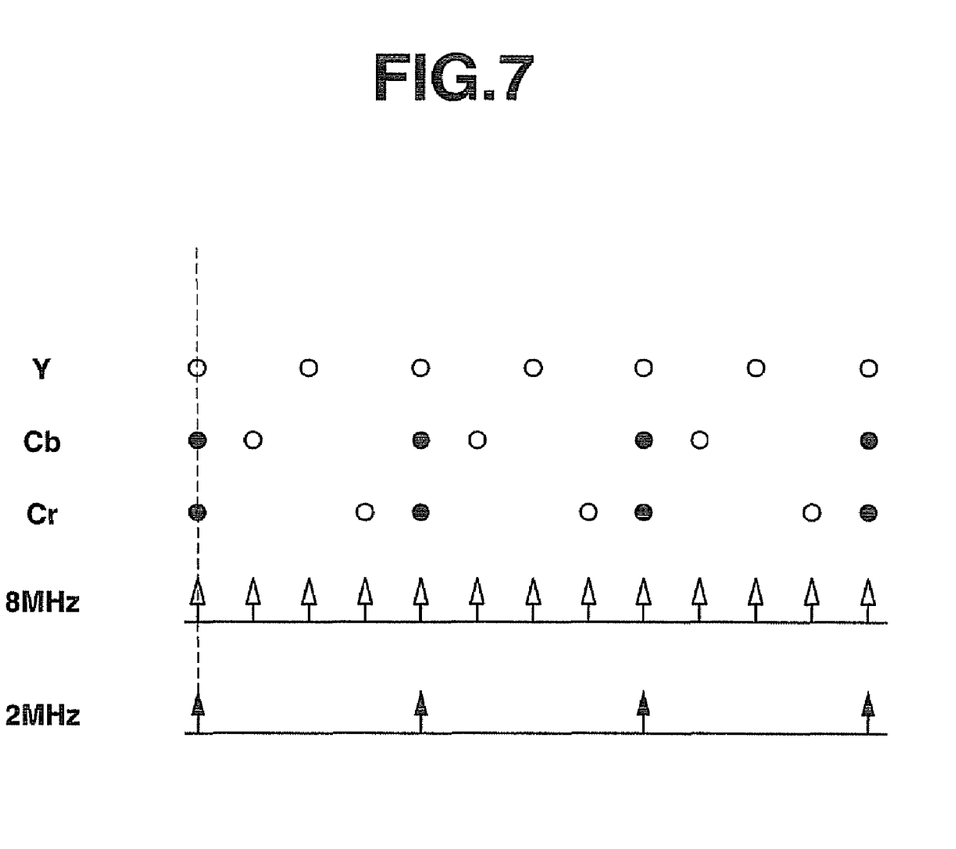
FIG. 7 is an illustrative view to illustrate an operation of the third embodiment.

Next, referring to an illustrative view of FIG. 7, an operation of the embodiment thus configured is described. FIG. 7 shows a sampling timing of the luminance signal Y inputted from the input terminals T1, T3, a sampling timing of the color difference signals Cb, Cr, a sampling timing of a sampling clock having a frequency of 16 MHz, and a sampling timing of a sampling clock having a frequency of 4 MHz.

It is now supposed that the A/D conversion processing circuit 55 processes three inputs of the luminance signal Y and the color difference signals Cb, Cr. The luminance signal Y and the color difference signals Cb, Cr are switched over at a cycle of 1/(16 [MHz]) by the switch 54 to be supplied to the A/D converter 56 as a serial signal. The A/D converter 56 performs sampling at the sampling timing of the sampling clock having the frequency 8 MHz shown in FIG. 7. White dots of FIG. 7 show sampling timings by the A/D converter 56. The A/D converter 56 outputs sample values of the white dot positions.

The S/P conversion circuit 57 separates output of the A/D converter 56 at the cycle of 16 MHz to parallelly output sample values of the luminance signal Y and the color difference signals Cb, Cr which are shown by the white dots. The sample values of the color difference signals Cb, Cr are supplied to the interpolation circuit 59a, 59b, respectively.

Sampling frequency of the luminance signal Y from the S/P conversion circuit 57 is 8 MHz, and that of the color difference signals Cb, Cr is 4 MHz. However, to assume the sampling timings for the luminance signal Y as a reference sampling timing as shown in FIG. 7, sampling timings of the color difference signals Cb, Cr are deviated by a cycle of 1/(16 [MHz]) to one another. The interpolation circuit 59a, 59b determine sample values at the reference sampling timing with respect to the color difference signals Cb, Cr through interpolation processing. That is, the interpolation circuit 59a determines the sample values (black dots) at the reference sampling timing by using a plurality of sample values of the color difference signal Cb before and after the reference sampling timing. Similarly, the interpolation circuit 59b determines the sample values (black dots) at the reference sampling timing by using a plurality of sample values of the color difference signal Cr before and after the reference sampling timing. The interpolation circuits 59a, 59b output the sample values determined by the interpolation processing as color difference signals Cb', Cr'.

On the other hand, the delay adjustment circuit 58 delays the sample values of the luminance signal Y by a time period necessary for the interpolation processing by the interpolation circuits 59a, 59b, so as to output the luminance signal Y at the same reference sampling timing as those of the color difference signals Cb, Cr, as a luminance signal Y' simultaneously with each of the color difference signals Cb', Cr'.

In this manner, the A/D conversion processing circuit 55 can digitally convert the luminance signal Y and the color difference signals Cb, Cr by the single A/D converter 56, while maintaining the sampling frequency necessary for the bandwidth of the luminance signal Y and the color difference signals Cb, Cr.

Next, it is supposed that the A/D conversion processing circuit 55 performs processing on the signal IN. In this case, the control circuit 50 causes the switch 54 to fixedly select the terminal e to supply the A/D converter 56 with a sampling clock having a frequency of fsh. The sampling frequency fsh is a frequency similar to, e.g., the frequency 16 MHz, and the A/D converter 56 digitally converts the signal IN using this sampling clock. The signal IN digitally converted by the A/D converter 56 is outputted as the signal O as-is.

Thus, the present embodiment enables A/D conversion processing commonly using the single A/D converter by, when converting to a digital signal either the one signal in the comparatively broad band or the three signals having different bandwidths in the comparatively narrow band, switching over the signal inputs of these two systems (four signals) by the switch and controlling the sampling clock of the A/D converter according to the signal bandwidths of those two systems. Because only the single A/D converter has to be provided for the two systems of inputs, waste of configuration is prevented even if only one of the two systems of inputs is inputted. Moreover, because only the single A/D converter has to be operated, increase in power consumption can be restrained.

Following is the optimum sampling clock frequency to be provided to the A/D converter when outputting m kinds of signals. Sampling frequency of an i-th signal is expressed as $x_i \cdot n$ (Hz), a total of sampling frequencies of the m kinds of signals as $\Sigma x_i$ (i is an integer not less than 1 and not more than m, and n is an arbitrary real number). If $x_i$ is an arbitrary integer and can be expressed by a divisor of $\Sigma x_i$, then the sampling clock frequency to be set to the A/D converter 56 is given as $\Sigma x_i \cdot n$ (Hz).

Because sampling frequency of each signal is to be determined to satisfy the sampling theorem based on bandwidth of each input signal, the present invention can be implemented by determining a sampling frequency of the A/D converter based on a sum of bandwidths of input signals.

In addition, the present invention can be achieved and effects thereof obtained even by causing the output signals of the A/D converter to have a uniform sampling frequency by frequency conversion processing to facilitate handling the signals, or even if not all of the outputs of the A/D converter are used.

Note that the above-described embodiments, each describing an exemplary case where there are multiple, i.e., two systems of inputs, are also likewise applicable to a case where there are three or more systems of inputs. In addition, the A/D conversion processing circuit is also feasible by software processing.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. An A/D conversion processing circuit comprising:
   a switch which selects an input from each of multiple systems, and which, if a system of a selected input has multiple inputs, sequentially switches over the multiple inputs to select each of the multiple inputs, and if a system of a selected input has a single input, fixedly selects the single input;
   an A/D converter which converts an output of the switch to a digital signal, the A/D converter obtaining the digital signal by performing sampling with a sampling frequency according to a necessary signal bandwidth;
   a separation section which separates signals included in an output of the A/D converter;
   an interpolation section which performs on each signal from the separation section an interpolation processing according to a deviation in sampling timing in the A/D converter, to obtain a signal where the multiple inputs are digitally converted at the same sampling timing; and
   an output section which outputs as-is an output of the A/D converter if a signal of the single input is inputted to the A/D converter from the switch.

2. The A/D conversion processing circuit according to claim 1, wherein
   the interpolation section performs the interpolation processing on a signal other than one of signals from the separation section, and
   the A/D conversion processing circuit includes a delay section which delays the one signal by a time period that is necessary for the interpolation processing.

3. The A/D conversion processing circuit according to claim 2, wherein the interpolation section is configured by a transversal filter.

4. The A/D conversion processing circuit according to claim 1, wherein, if signals of the multiple inputs are serially inputted from the switch, the A/D converter determines the sampling frequency based on a sum of bandwidths of the signals of the multiple inputs.

5. The A/D conversion processing circuit according to claim 4, wherein, if m kinds of signals are inputted to the A/D converter as the signals of the multiple inputs, a sampling clock frequency to be set to the A/D converter is given as $\Sigma xi \cdot n$ (Hz), provided that a sampling frequency of an i-th signal is $xi \cdot n$ (Hz), a total of sampling frequencies of the m kinds of signals is $\Sigma xi$ (i is an integer not less than 1 and not more than m, and n is an arbitrary real number), and that xi is an arbitrary integer and can be expressed by a divisor of $\Sigma xi$.

6. The A/D conversion processing circuit according to claim 1, wherein the multiple inputs of signals are I, Q signals obtainable by quadrature conversion and the single input of signal is an intermediate frequency signal.

7. The A/D conversion processing circuit according to claim 1, wherein the signals of the multiple inputs are color difference signals included in a digital broadcast signal, and the signal of the single input is a luminance signal included in the digital broadcast signal.

8. A demodulation device comprising:
   an A/D conversion processing circuit comprising,
      a switch which selects an input from each of multiple systems, and which, if a system of a selected input has multiple inputs, sequentially switches over the multiple inputs to select each of the multiple inputs, and if a system of a selected input has a single input, fixedly selects the single input,
      an A/D converter which converts an output of the switch to a digital signal, the A/D converter obtaining the digital signal by performing sampling with a sampling frequency according to a necessary signal bandwidth,
      a separation section which separates signals included in an output of the A/D converter,
      an interpolation section which performs on each signal from the separation section an interpolation processing according to a deviation in sampling timing in the A/D converter, to obtain a signal where the multiple inputs are digitally converted at the same sampling timing, and
      an output section which outputs as-is an output of the A/D converter if a signal of the single input is inputted to the A/D converter from the switch;
   a quadrature detection circuit which quadrature-detects an output of the output section; and
   a switch section which selectively outputs one of an output of the interpolation section and an output of the quadrature detection circuit.

9. The demodulation device according to claim 8, comprising a downsampling circuit which downsamples the output of the quadrature detection circuit and providing the downsampled output to the switch section.

10. The demodulation device according to claim 8, wherein the interpolation section performs an interpolation processing on a signal other than one of signals from the separation section, and includes a delay section which delays the one signal by a time period that is necessary for the interpolation processing.

11. The demodulation device according to claim 8, wherein, if signals of the multiple inputs are serially inputted from the switch, the A/D converter determines the sampling frequency based on a sum of bandwidths of signals of the multiple inputs.

12. The demodulation device according to claim 11, wherein, if m kinds of signals are inputted to the A/D converter as the signals of the multiple inputs, a sampling clock frequency to be set to the A/D converter is given as $\Sigma xi \cdot n$ (Hz), provided that a sampling frequency of an i-th signal is $xi \cdot n$ (Hz), a total of sampling frequencies of the m kinds of signals is $\Sigma xi$ (i is an integer not less than 1 and not more than m, and n is an arbitrary real number), and that xi is an arbitrary integer and can be expressed by a divisor of $\Sigma xi$.

13. The demodulation device according to claim 8, wherein the multiple inputs of signals are I, Q signals obtainable by quadrature conversion and the single input of signal is an intermediate frequency signal.

14. An A/D conversion processing method comprising:
   if a system of an input selected by a switch which selects an input from each of multiple systems has multiple inputs, the switch sequentially switching over the multiple inputs to select each of the multiple inputs, and if a system of an input selected by the switch has a single input, the switch fixedly selecting the single input;
   converting an output of the switch to a digital signal by performing sampling of the output using a sampling frequency according to a necessary signal bandwidth by an A/D converter;
   separating signals included in an output of the A/D converter;
   performing interpolation processing on each of separated signals according to deviation in sampling timing in the A/D converter to obtain a signal where the multiple inputs are digitally converted at the same sampling timing; and outputting as-is an output of the A/D converter if a signal of the single input is inputted to the A/D converter from the switch, wherein, if signals of the multiple inputs are serially inputted from the switch in the processing by the A/D converter, the sampling frequency is determined based on a sum of bandwidths of the multiple inputs of signals.

15. The A/D conversion processing method according to claim 14, wherein the interpolation processing is performed on a signal other than one of the separated signals, and the one signal is delayed by a delay section by a time period that is necessary for the interpolation processing.

16. The A/D conversion processing method according to claim 14, wherein, if m kinds of signals are inputted to the A/D converter as the signals of the multiple inputs, a sampling clock frequency to be set to the A/D converter is given as $\Sigma x_i \cdot n$ (Hz), provided that a sampling frequency of an i-th signal is $x_i \cdot n$ (Hz), a total of sampling frequencies of the m kinds of signals is $\Sigma x_i$ (i is an integer not less than 1 and not more than m, and n is an arbitrary real number), and that $x_i$ is an arbitrary integer and can be expressed by a divisor of $\Sigma x_i$.

17. The A/D conversion processing method according to claim 14, wherein the signals of the multiple inputs are color difference signals included in a digital broadcast signal, and the signal of the single input is a luminance signal included in the digital broadcast signal.

* * * * *